(12) United States Patent
Nguyen et al.

(10) Patent No.: US 10,564,506 B2
(45) Date of Patent: Feb. 18, 2020

(54) ELECTROCHROMIC DEVICE AND METHOD FOR MAKING ELECTROCHROMIC DEVICE

(71) Applicant: View, Inc., Milpitas, CA (US)

(72) Inventors: Paul P. Nguyen, San Jose, CA (US); Shiwei Liu, Santa Rosa, CA (US)

(73) Assignee: View, Inc., Milpitas, CA (US)

( * ) Notice: Subject to any disclaimer, the term of this patent is extended or adjusted under 35 U.S.C. 154(b) by 0 days.

(21) Appl. No.: 15/876,883

(22) Filed: Jan. 22, 2018

(65) Prior Publication Data

US 2018/0307110 A1 Oct. 25, 2018

Related U.S. Application Data

(63) Continuation of application No. 14/465,727, filed on Aug. 21, 2014, now abandoned, which is a (Continued)

(51) Int. Cl.
*G02F 1/155* (2006.01)
*C23C 14/18* (2006.01)
*C23C 14/08* (2006.01)

(52) U.S. Cl.
CPC ............ *G02F 1/155* (2013.01); *C23C 14/083* (2013.01); *C23C 14/086* (2013.01); *C23C 14/18* (2013.01); *G02F 2001/1555* (2013.01)

(58) Field of Classification Search
USPC ...................................... 427/66, 126.1–126.6
See application file for complete search history.

(56) References Cited

U.S. PATENT DOCUMENTS 4,194,962 A   3/1980 Chambers et al.
4,664,890 A   5/1987 Tawada et al.
(Continued)

FOREIGN PATENT DOCUMENTS

WO   WO2008/096089   8/2008

OTHER PUBLICATIONS

International Search Report and Written Opinion dated Aug. 13, 2010 from PCT International Application No. PCT/US2009/006764.
(Continued)

*Primary Examiner* — Jose Hernandez-Diaz
(74) *Attorney, Agent, or Firm* — Weaver Austin Villeveuve & Sampson LLP; Brian D. Griedel

(57) ABSTRACT

A method for lithiating an electrochromic device comprise forming a first transparent conductive layer on a substrate, forming an electrochromic structure on the first transparent conductive layer, forming a second transparent conductive layer on the electrochromic structure, and lithiating the electrochromic structure through the second transparent conductive layer. In one exemplary embodiment lithiating the electrochromic structure comprises lithiating the electrochromic structure at a temperature range of between about room temperature and about 500 C for the duration of the lithiation process. In another exemplary embodiment, lithiating the electrochromic structure further comprises lithiating the electrochromic structure by using at least one of sputtering, evaporation, laser ablation and exposure to a lithium salt. The electrochromic device can be configured in either a "forward" or a "reverse" stack configuration.

14 Claims, 5 Drawing Sheets

Related U.S. Application Data continuation of application No. 12/347,953, filed on Dec. 31, 2008, now Pat. No. 8,842,357.

(56) References Cited

U.S. PATENT DOCUMENTS

| | | | |
|---|---|---|---|
| 5,019,420 A | 5/1991 | Rauh | |
| 5,133,594 A | 7/1992 | Haas et al. | |
| 5,532,869 A | 7/1996 | Goldner et al. | |
| 5,538,610 A | 7/1996 | Gesche et al. | |
| 5,683,561 A | 11/1997 | Hollars et al. | |
| 5,830,336 A | 11/1998 | Schulz | |
| 6,094,292 A | 7/2000 | Goldner et al. | |
| 6,358,377 B1 | 3/2002 | Schloremberg et al. | |
| 6,488,824 B1 | 12/2002 | Hollars et al. | |
| 6,652,974 B1 | 11/2003 | Krisko | |
| 6,893,544 B2 | 5/2005 | Song et al. | |
| 7,150,810 B2 | 12/2006 | Hasegawa | |
| 7,372,610 B2 | 5/2008 | Burdis et al. | |
| 7,678,198 B2 | 3/2010 | Hartig | |
| 7,998,762 B1 | 8/2011 | Lee et al. | |
| 8,133,368 B2 | 3/2012 | Hawrylchak et al. | |
| 8,842,357 B2 | 9/2014 | Nguyen et al. | |
| 9,429,809 B2 | 8/2016 | Kailasam et al. | |
| 9,477,129 B2 | 10/2016 | Kozlowski et al. | |
| 9,664,974 B2 | 5/2017 | Kozlowski et al. | |
| 2001/0003628 A1 | 6/2001 | Demiryont | |
| 2004/0104110 A1* | 6/2004 | Lee | C23C 14/34 204/192.1 |
| 2004/0150867 A1 | 8/2004 | Lee et al. | |
| 2004/0155263 A1 | 8/2004 | Giron | |
| 2006/0209383 A1* | 9/2006 | Burdis | G02F 1/1523 359/265 |
| 2007/0097481 A1 | 5/2007 | Burdis et al. | |
| 2008/0169185 A1 | 7/2008 | Burdis et al. | |
| 2008/0304130 A1 | 12/2008 | Nguyen | |
| 2009/0057137 A1 | 3/2009 | Pitts et al. | |
| 2009/0162697 A1* | 6/2009 | Cheng | C23C 16/407 428/702 |
| 2010/0071810 A1 | 3/2010 | Nadaud et al. | |
| 2010/0108500 A1 | 5/2010 | Hawrylchak et al. | |
| 2010/0126415 A1 | 5/2010 | Ishino et al. | |
| 2010/0165440 A1 | 7/2010 | Nguyen et al. | |
| 2015/0077827 A1 | 3/2015 | Nguyen et al. | |

OTHER PUBLICATIONS

Lampert, C.M., "Toward large-area photovoltaic nanocells: experiences learned from smart window technology," Solar Energy Materials and Solar Cells 32 (1994), pp. 307-321.

International Preliminary Report on Patentability dated Jul. 5, 2011 from PCT International Application No. PCT/US2009/006764.

In the Matter of the application of Percy St. George Kirke, 5 USPQ 539.

Notice of Allowance dated Jun. 13, 2014 in U.S. Appl. No. 12/347,953.

Office Action dated Oct. 29, 2010 in U.S. Appl. No. 12/347,953.

Office Action dated Mar. 19, 2010 in U.S. Appl. No. 12/347,953.

Final Office Action dated Feb. 28, 2011 in U.S. Appl. No. 12/347,953.

Final Office Action dated Aug. 18, 2010 in U.S. Appl. No. 12/347,953.

Examiner's Answer dated Jul. 27, 2011 in U.S. Appl. No. 12/347,953.

Decision on Appeal dated Mar. 24, 2014 in U.S. Appl. No. 12/347,953.

Office Action dated Sep. 1, 2016 in U.S. Appl. No. 14/465,727.

Notice of Allowance dated Mar. 17, 2017 in U.S. Appl. No. 14/465,727.

Supplemental Notice of Allowance dated Apr. 5, 2017 in U.S. Appl. No. 14/465,727.

Notice of Allowance dated Oct. 23, 2017 in U.S. Appl. No. 14/465,727.

* cited by examiner

ELECTROCHROMIC DEVICE AND METHOD FOR MAKING ELECTROCHROMIC DEVICE

CROSS-REFERENCE TO RELATED APPLICATION

This application is a continuation of U.S. patent application Ser. No. 14/465,727, filed Aug. 21, 2014, by Nguyen et al., which is in turn a continuation of U.S. patent application Ser. No. 12/347,953, filed Dec. 31, 2008, by Nguyen et al., now U.S. Pat. No. 8,842,357, both of which are titled ELECTROCHROMIC DEVICE AND METHOD FOR MAKING ELECTROCHROMIC DEVICE, and both of which are herein incorporated by reference in their entireties and for all purposes.

BACKGROUND

The subject matter disclosed herein relates to an electrochromic device. More particularly, the subject matter disclosed herein relates to a multi-layer electrochromic stack and a method for making the multi-layer electrochromic stack.

The field of electrochromics is extensive and has been developing over about the last forty years. In one application, an electrochromic coating is used for controlling the amount of light and heat passing through the window based on a user-controlled electrical potential that is applied across the optical stack of the electrochromic coating. Not only can an electrochromic coating reduce the amount of energy used for room heating and/or air conditioning, an electrochromic coating can also be used for providing privacy. By switching between a clear state having an optical transmission of about 60-80% and a darkened state having an optical transmission of between 0.1-10%, both energy flow into a room through a window and privacy provided by the window can be controlled. The amount of glass used for various types of windows, such as skylights, aircraft windows, residential and commercial building windows, and automobile windows, is on the order of one billion square meters per year. Accordingly, the potential energy saving provided by electrochromic glazing is substantial. See, for example, Solar Energy Materials and Solar Cells, (1994) pp. 307-321.

Over the forty years that electrochromics have been developing, various structures for electrochromic devices have been proposed including, solution-phase electrochromic devices, solid-state electrochromic devices, gasochromic devices, and photochromic devices.

For example, a conventional electrochromic cell generally is structured as follows: a substrate, a transparent conductive layer, a counter electrode, an ion transport (or ion conductor) layer, an electrochromic layer, and a transparent conductive layer. Conventional cathodic materials, commonly referred to as "electrochromic electrodes," have included tungsten oxide $WO_3$ (most common), vanadium oxide $V_2O_5$, niobium oxide $Nb_2O_3$ and iridium oxide $IrO_2$. Anodic materials, commonly referred to as "counter electrodes," include nickel oxide NiO, tungsten-doped nickel oxide, and iridium oxide $IrO_2$. The ion transport layer materials exhibit a poor electron conductor, but a good ion conductor. Examples of ion transport layer materials include $SiO_2$, $TiO_2$, $AlO_3$, and $Ta_2O_5$.

Various types of transparent conducting thin films have been employed for the first and second transparent conducting layers, such as, indium tin oxide ITO, which is the most commonly used material. Other thin metal layers have also been used, such as fluorine-doped tin oxide, antimony-doped tin oxide, and fluorine-doped aluminum oxide. Regardless which thin film is used, conductivities of less than about 20 Ohms/□ are needed in order to produce a uniform voltage between the two conductive layers across the conductive layers. Even lower conductivities than about 20 Ohms/□ are needed for large panes of glass measuring 3-4 feet across.

If a voltage of between −5 V to +5 V is applied between the first and second transparent conducting layers, the following reactions take place. At the anode, the following reaction takes place:

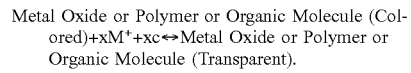

At the cathode, the following reaction takes place:

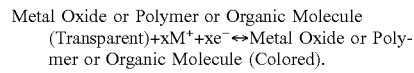

in which M is $H^+$, $Li^+$ or $Na^+$, e is an electron, and x is an integer.

BRIEF DESCRIPTION OF THE DRAWINGS

The subject matter disclosed herein is illustrated by way of example and not by limitation in the accompanying figures in which like reference numerals indicate similar elements and in which.

DETAILED DESCRIPTION

The word "exemplary" is used herein to mean "serving as an example, instance, or illustration." Any embodiment described herein as "exemplary" is not to be construed as necessarily preferred or advantageous over other embodiments. Additionally, the term "last" or "top" when used in reference to a layer of a multi-layer electrochromic device refers to a layer that is toward the top of a device as depicted in the Figures.

Figure 1:
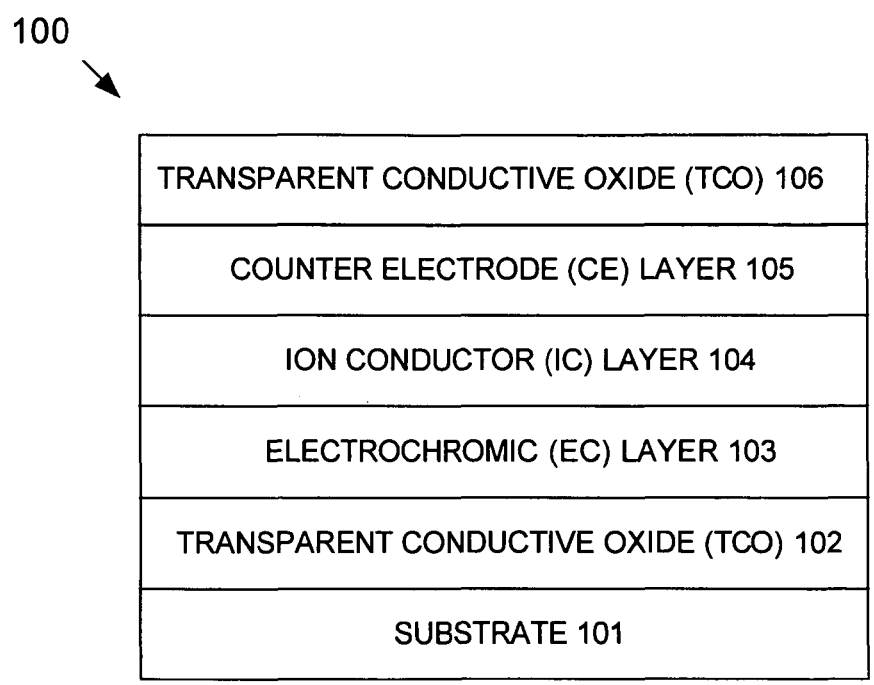
FIG. 1 depicts an exemplary embodiment of a forward arrangement of a multilayer electrochromic device.

FIG. 1 depicts an exemplary embodiment of a forward arrangement of a multilayer electrochromic device 100. Multi-layer electrochromic device (or stack) 100 comprises a first transparent conductive oxide (TCO) layer 102 that is formed on a transparent substrate 101. First TCO layer 102 is formed to have a thickness about 10 nm to about 1000 nm, and can be formed from, for example, indium tin oxide (ITO) (most common), aluminum zinc oxide (AZO), fluorine-doped tin oxide (FTO), antimony-doped tin oxide (ATO), or fluorine-doped aluminum oxide (FAO). An electrochromic (EC) layer 103 is formed on first TCO layer 102. EC layer 103 is formed to have a thickness about 10 nm to about 1000 nm, and is formed from a cathodic electrochromic material, such as, tungsten oxide $WO_3$ (most common), molybdenum oxide $MoO_3$, vanadium oxide $V_2O_5$, niobium oxide $Nb_2O_3$ and iridium oxide $IrO_2$.

An ion conductor (IC) layer 104 is formed on EC layer 103. IC layer 104 is formed to have a thickness about 10 nm to about 2000 nm, and can be formed to be about silicon dioxide $SiO_2$, titanium dioxide $TiO_2$, aluminum oxide $Al_2O_3$, tantalum oxide $Ta_2O_5$, and zirconium oxide $ZrO_2$. A counter electrode (CE) layer 105 is formed on IC layer 104. CE layer 105 is formed to have a thickness of about 10 nm to about 1000 nm, and can be formed from an anodic electrochromic material, such as nickel oxide NiO, iridium oxide $IrO_2$, cobaltous oxide CoO, tungsten-doped nickel oxide, vanadium-doped nickel oxide, and aluminum-doped nickel oxide.

A second (or top) TCO layer 106 is formed on CE layer 105: Second TCO layer 106 is formed to have a thickness about 10 nm to about 1000 nm, and can be formed from, for example, indium tin oxide (ITO) (most common), aluminum zinc oxide (AZO), fluorine-doped tin oxide (FTO), antimony-doped tin oxide (ATO), or fluorine-doped aluminum oxide (FAO).

It should be understood that a multi-layer electrochromic device could be formed in a reverse order from the order of the layers of (forward arrangement) multi-layer electrochromic device 100 so that a first TCO layer is formed on a substrate, a counter electrode (CE) layer is formed on the first TCO layer, an ion conductor (IC) layer is formed on the CE layer, an electrochromic (EC) layer formed on the IC layer, and a second TCO layer formed on the EC layer.

The respective layers of multi-layer electrochromic device 100 are formed using well-known techniques, such as sputtering, evaporation, laser ablation and atomic-layer deposition (ATE). When multi-layer electrochromic device 100 is conventionally formed, the EC layer, IC layer and/or CE layer are optionally lithiated using separate dry lithiation steps in which lithium is deposited via conventional deposition techniques, such as sputtering, evaporation and/or laser ablation techniques, onto the (EC, IC or CE) layer below. Each lithiation step can be titrated (i.e., depositing a determined amount of lithium) in order to provide a desired switching performance for the multi-layer electrochromic device.

As the top TCO layer is deposited on a lithiated layer, intercalation compounds are likely to be formed in the host lattices of the TCO through up-diffusion of lithium. The term "up-diffusion," as it is used herein means the lithium used for directly lithiating an electrochromic layer migrates into the TCO layer from the lithiated layer below.

The up-diffusion of lithium into the TCO layer is irreversible (or at least partially irreversible) and has two deleterious effects on the whole stack. First, intercalation of lithium degrades the optical properties of the TCO, thereby resulting in the energy loss as light passes through TCO layer. Second, in a typical forward arrangement (i.e., the configuration of layers depicted in FIG. 1) of EC devices, the counter electrode is deposited immediately before the TCO layer, and is generally fully or partially bleached to achieve a more porous structure and reduce the blind charge. As used herein, the term "blind charge" refers to the lithium lost during the process of lithiation or switching of the device. The "lost" lithium will not shuttle between the two electrodes of EC devices while switching. Lithium inside the counter electrode will, however, be partially lost during the deposition of TCO layer, thereby reducing the overall level of available of lithium to the EC device resulting in low-light transmission for the counter electrode. Typically, an electrochromic device that has been formed using conventional direct lithiated techniques loses between about 5% to about 15% of bleached-state transmission and transmission range during the deposition of the top TCO layer. Thus, high transmission in the bleached state of an EC device has been difficult to achieve because the conventional technique of directly lithiating an electrochromic layer immediately before forming the last TCO layer causes the transmission of the TCO layer to be degraded as lithium is up-diffused into the TCO layer.

To avoid up-diffusion of lithium into the top TCO layer, the subject matter disclosed herein provides a technique in which the top electrochromic layer of a multi-layer electrochromic stack is lithiated through the top TCO layer using a well-known technique, such as sputtering, evaporation and/or by laser ablation. Additionally, lithiation can be performed by exposing the electrochromic device to a lithium salt. Under certain temperature conditions, lithium is not incorporated into the top TCO layer when lithiation of the electrochromic layer is performed through the top TCO layer. Lithiation of the top electrochromic layer can be performed through a top TCO layer when the top TCO layer has a thickness between about 10 nm thick to about 1000 nm thick. According to the subject matter disclosed herein, lithium is not incorporated into the top TCO layer when the lithiation is performed in a temperature range of between about 60 C to about 500 C for a time period of between about one minute and about two hours. In another exemplary embodiment, when the top TCO layer is only about 20 nm thick, lithiation of the top electrochromic layer can be performed through the top TCO layer at about room temperature without heating. The minimal temperature for a lithiation-through-TCO process depends on the thickness and physical properties of the TCO layer. Generally, the thicker and denser the top TCO layer, the greater the temperature that should be used for a lithiation-through-TCO process. It is also possible to lithiate an electrochromic layer all the way through an electrochromic stack depending on the amount of lithium that is used regardless whether the stack is a forward or a reverse stack.

According to one exemplary embodiment, a technique for forming a multi-layer electrochromic device comprises lithiating the last (or top) electrochromic layer through the last (or top) TCO layer of the multi-layer stack. For example, lithiation of a top electrochromic layer through about a 130 nm thick ITO layer should be at a temperature that is greater than about 150 C for the duration of the lithiation process.

When the top electrochromic layer is lithiated through the top TCO according to the subject matter disclosed herein, the transmission of the EC device in the bleached state is improved by about 5% to about 15%. Additionally, the color of the EC device is also improved in the bleached state. Moreover, lithiating an EC device in the bleached state through the top TCO layer results in the maximal transmission occurring at the visible light wavelength, while, in contrast, directly lithiating an EC device in a conventional manner often results in the maximal transmission occurring at the near infrared (IR). Further, lithiating an EC device through the top TCO provides a larger transmission range than the transmission range of a directly lithiated EC device. Lithiation through the top TCO layer also allows for addition of lithium Li into a multi-layer electrochromic device, thereby optimizing the performance of the multi-layer stack.

Figure 2:
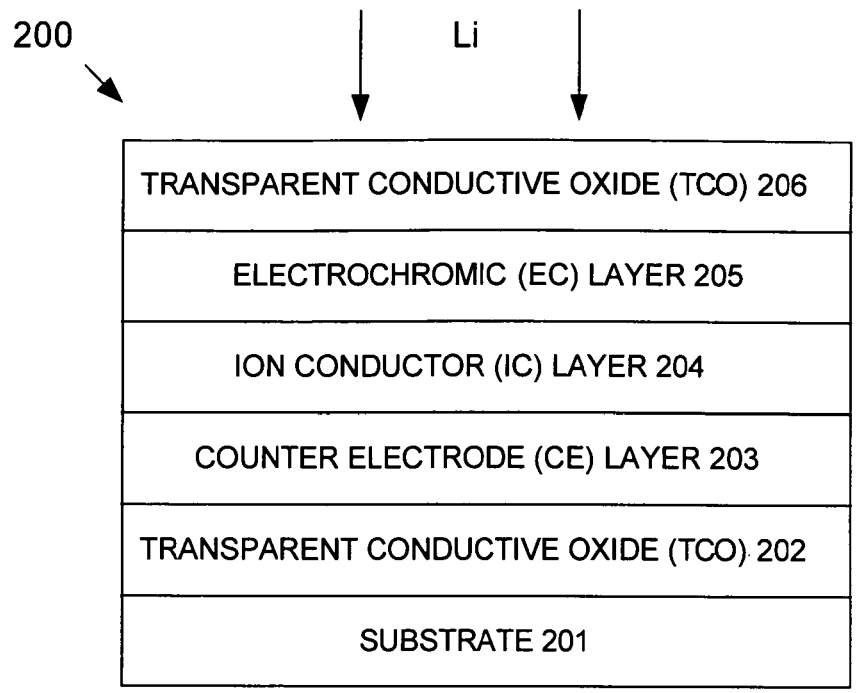
FIG. 2 depicts a first exemplary embodiment of a multi-layer electrochromic device formed by the subject matter disclosed herein.

FIG. 2 depicts a first exemplary embodiment of a multi-layer an electrochromic device 200 formed by the subject matter disclosed herein. Electrochromic device 200 comprises a transparent substrate 201, such as glass, a transparent conductive oxide (TCO) layer 202, such as FTO, a counter electrode (CE) layer 203, such as tungsten-doped nickel oxide, an ion conductor (IC) layer 204, such as tantalum oxide $Ta_2O_5$, an electrochromic (EC) layer 205, such as tungsten oxide $WO_3$, and a second (last or top) transparent conductive oxide (TCO) layer 206. The stack order of electrochromic device 200 is commonly referred to as a "reverse" stack. Each layer of device 200 is formed in a well-known manner, such as by sputtering, evaporation, laser ablation and atomic-layer deposition (ATE). The thickness of each layer of device 200 is between about 100 nm to about 400 nm. As electrochromic device 200 is formed, counter electrode (CE) layer 203 and ion conductor (IC) 204 can be optionally directly lithiated in a conventional manner, but electrochromic (EC) layer 205 is not directly lithiated, as might be conventionally done. Instead, TCO layer 206 is formed EC layer 205, and EC layer 205 is lithiated through TCO layer 206 using Li vapor at a temperature that is greater than about 150 C.

In one alternative exemplary embodiment, top TCO layer 206 could be formed from two layers of a TCO material. For example, a first TCO sublayer 206a (not shown) could be formed to be between about 10 nm to about 500 nm thick. EC layer 205 would then be lithiated through TCO sublayer 206a with or without heating. A second TCO sublayer 206b (not shown) would then be formed in a well-known manner on TCO sublayer 206a formed to be between about 10 nm to about 500 nm thick. EC layer 205 could then be lithiated through both TCO sublayer 206a and TCO sublayer 206b with or without heating.

Figure 3:
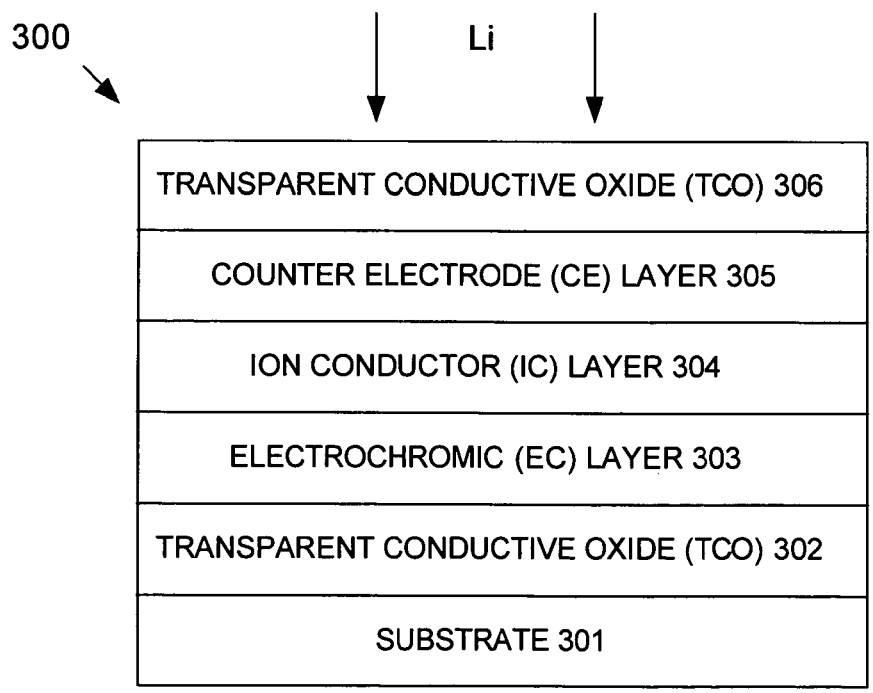
FIG. 3 depicts a second exemplary embodiment of a multi-layer electrochromic device formed by the subject matter disclosed herein.

FIG. 3 depicts a second exemplary embodiment of a multi-layer an electrochromic device 300 formed by the subject matter disclosed herein. Electrochromic device 300 comprises a transparent substrate 301, such as glass, a first transparent conductive oxide (TCO) layer 302, such as FTO, an electrochromic (EC) layer 303, such as tungsten oxide $WO_3$, an ion conductor (IC) layer 304, such as tantalum oxide $Ta_2O_5$, a counter electrode (CE) layer 305, such as tungsten-doped nickel oxide, and a second (last or top) transparent conductive oxide (TCO) layer 306. The stack order of electrochromic device 300 is commonly referred to as a "forward" stack. Each layer of device 300 is formed in a well-known manner, such as by sputtering, evaporation, laser ablation and atomic-layer deposition (ATE). The thickness of each layer of device 300 is between about 100 nm to about 400 nm. As electrochromic device 300 is formed, electrochromic (EC) layer 303 and ion conductor (IC) 304 can be optionally directly lithiated in a conventional manner, but counter electrode (CE) layer 305 is not directly lithiated, as might be conventionally done. Instead, TCO layer 306 is formed on CE layer 305, and CE layer 305 is lithiated through TCO layer 306 using Li vapor at a temperature that is greater than about 150 C.

In one alternative exemplary embodiment, top TCO layer 306 could be formed from two layers of a TCO material. For example, a first TCO sublayer 306a (not shown) could be formed to be between about 10 nm to about 500 nm thick. CE layer 305 would then be lithiated through TCO sublayer 306a with or without heating. A second TCO sublayer 306b (not shown) would then be formed in a well-known manner on TCO sublayer 306a formed to be between about 10 nm to about 500 nm thick. CE layer 305 could then be lithiated through both TCO sublayer 306a and TCO sublayer 306b with or without heating.

Figure 4:
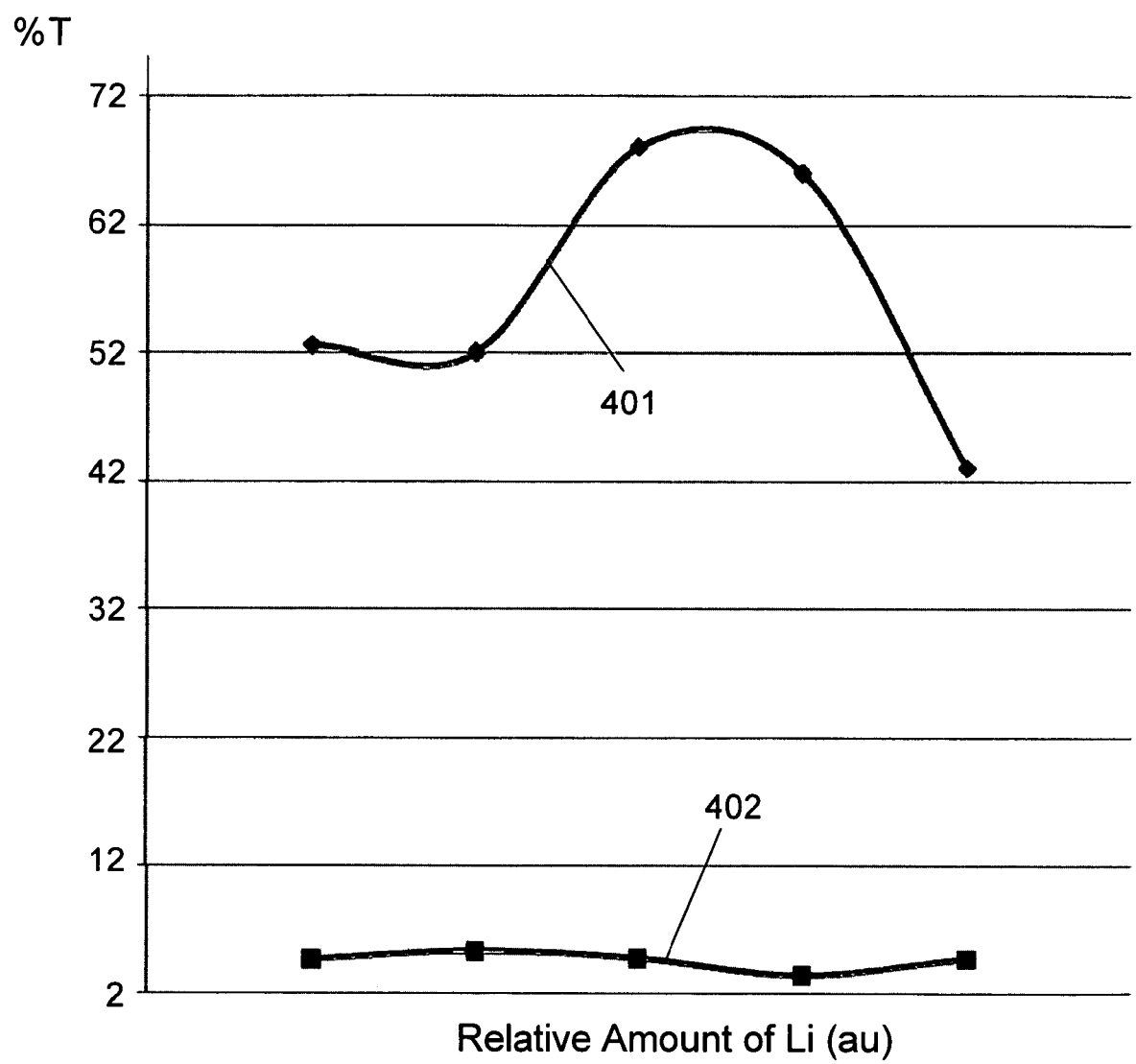
FIG. 4 is a graph depicting the percentage transmission (% T) as a function of the relative amount of lithium in arbitrary units (au) for an exemplary embodiment of a reverse-stack electrochromic device that has been lithiated through the top TCO.

FIG. 4 is a graph depicting the percentage transmission (% T) as a function of the relative amount of lithium in arbitrary units (au) for an exemplary embodiment of a reverse-stack electrochromic device that has been lithiated through the top TCO. "Arbitrary units" are used for the relative amount of lithium. The transmission has been measured by a silicon detector. Other types of detects will provide a different percentage transmission than depicted in FIG. 4. Percentage transmission (% T) for the bleached state is indicated at 401. Percentage transmission (% T) for the colored state is indicated at 402. As shown in FIG. 4, the percentage transmission increases from about 52% to about 68% as the relative amount of lithium is used. The percentage transmission then begins to drop as the relative amount of lithium increases beyond the peak percentage transmission.

Figure 5:
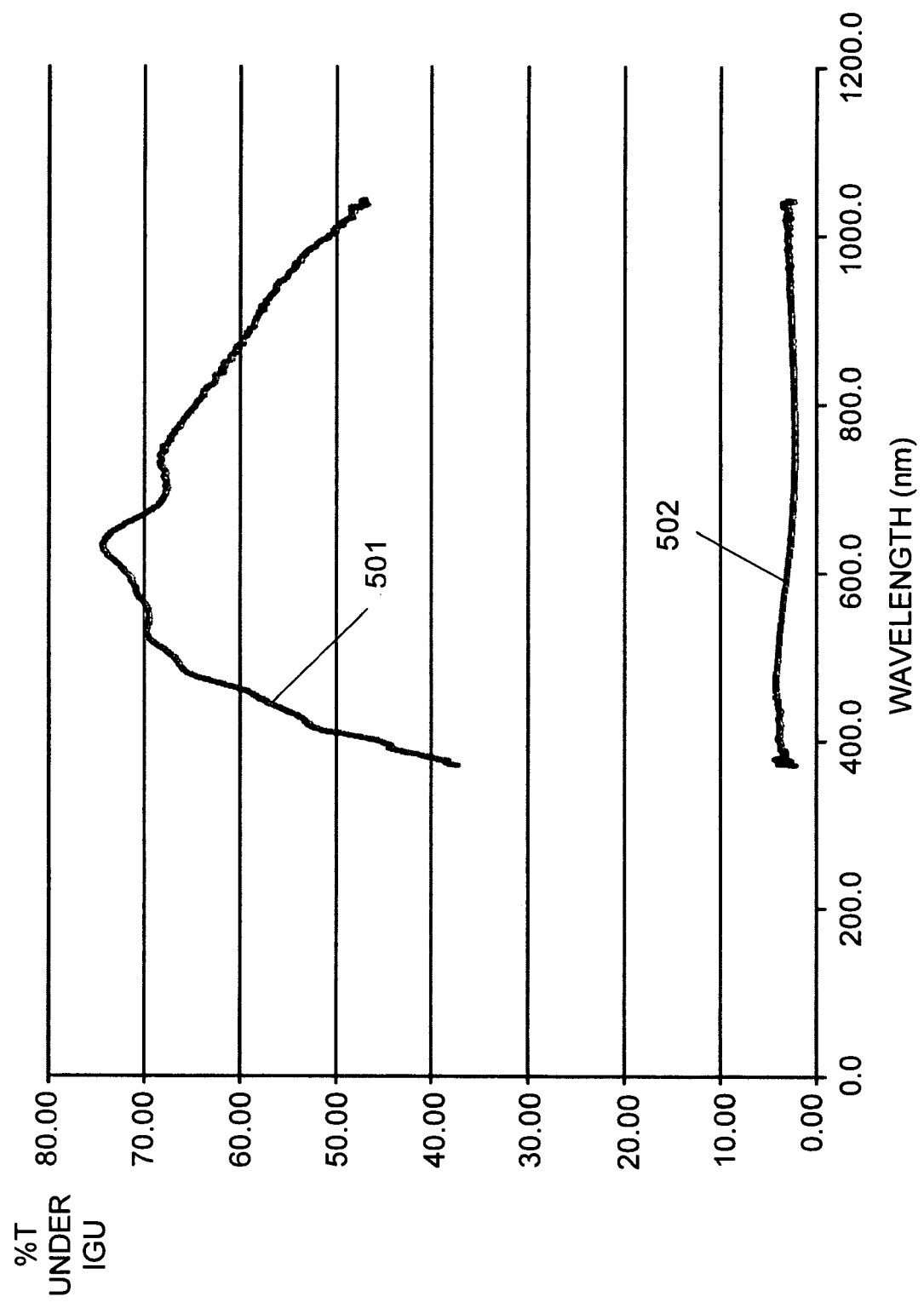
FIG. 5 is a graph depicting the percentage transmission (% T) as a function of wavelength for an exemplary embodiment of a reverse-stack electrochromic device that has been lithiated through the top TCO.

FIG. 5 is a graph depicting the percentage transmission (% T) as a function of wavelength for an exemplary embodiment of a reverse-stack electrochromic device that has been lithiated through the top TCO. The spectrum shown in FIG. 5 is for an electrochromic device that has been formed as part of an Insulated Glass Unit (IGU). Percentage transmission (% T) for the bleached state is indicated at 501. Percentage transmission (% T) for the colored state is indicated at 502. As shown in FIG. 5, the percentage transmission (% T) for the bleached state ranges from about 38% to about 75% over a wavelength range of about 380 nm to about 1050 nm. The percentage transmission for the colored state is less than or equal to about 5% over a wavelength range of about 380 nm to about 1050 nm.

Figure 6:
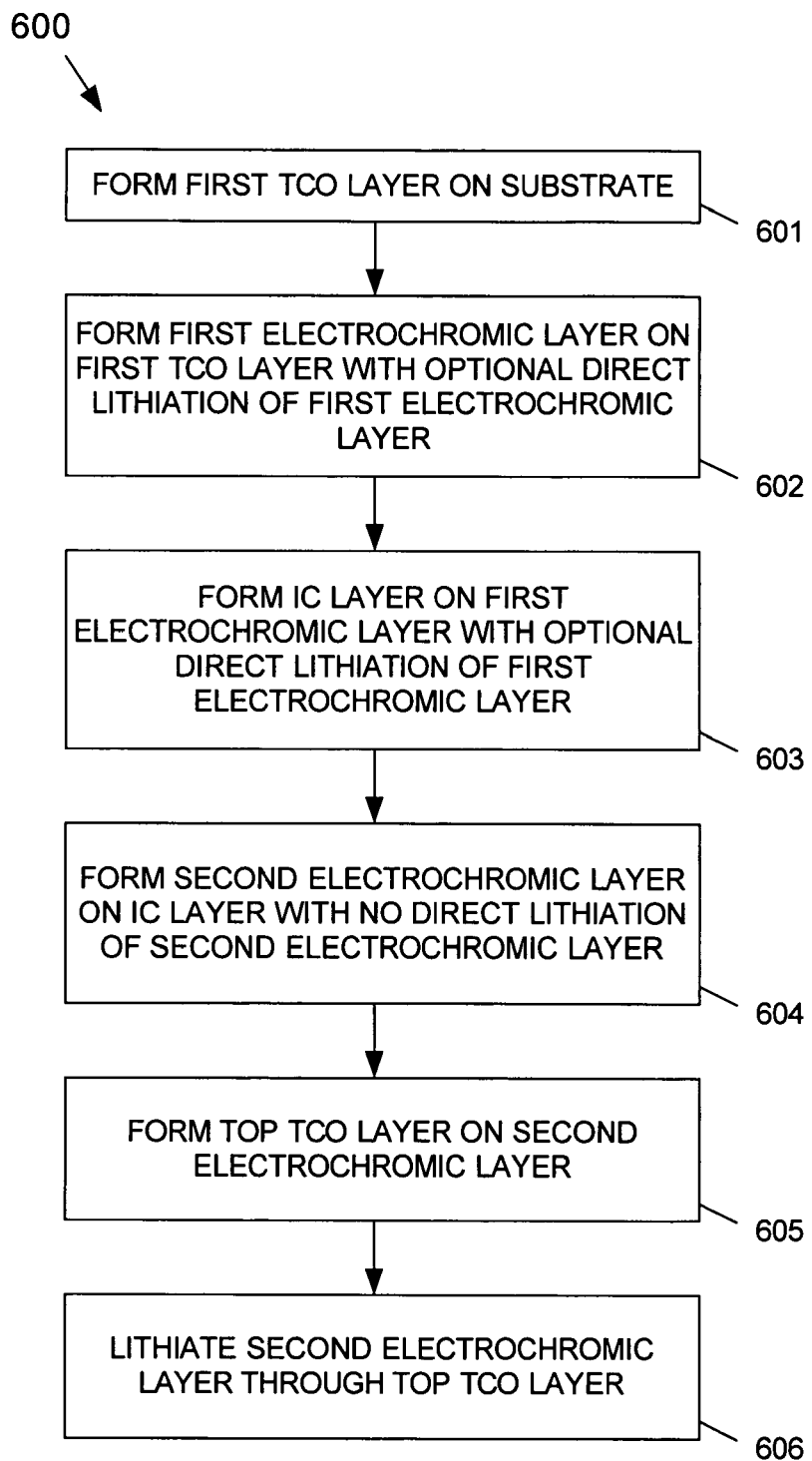
FIG. 6 depicts a method for forming a multi-layer electrochromic device according to the subject matter disclosed herein.

FIG. 6 depicts a method 600 for forming a multi-layer electrochromic device according to the subject matter disclosed herein. At step 601, a first TCO layer is formed in a well-known manner on a substrate. At step 602, a first electrochromic layer is formed in a well-known manner on the first TCO layer. In one exemplary embodiment, the first electrochromic layer is an electrochromic (EC) layer. In an alternative exemplary embodiment, the first electrochromic layer is a counter electrode (CE) layer. At step 602, a conventional direct lithiation of the first electrochromic layer can be optionally performed in a well-known manner. At step 603, an ion conductor (IC) layer is formed in a well-known manner on the first electrochromic layer. A conventional direct lithiation of the IC layer can be optionally performed in a well-known manner. At step 604, a second electrochromic layer is formed in a well-known manner on the IC layer. In one exemplary embodiment, the second electrochromic layer is a counter electrode (CE) layer. In an alternative exemplary embodiment, the second electrochromic layer is an electrochromic (EC) layer. At step 604, no conventional direct lithiation of the second electrochromic layer is performed. At step 605, a top TCO layer is formed in a well-known manner on the second electrochromic layer. At step 606, the second electrochromic layer is lithiated through the top TCO layer using, for example, sputtering, evaporation and/or laser ablation techniques.

Although the foregoing disclosed subject matter has been described in some detail for purposes of clarity of understanding it will be apparent that certain changes and modifications may be practiced that are within the scope of the appended claims. Accordingly, the present embodiments are to be considered as illustrative and not restrictive, and the subject matter disclosed herein is not to be limited to the details given herein, but may be modified within the scope and equivalents of the appended claims.

We claim:

1. A method of fabricating an electrochromic device, the method comprising:
   a. depositing on a transparent substrate, having a first transparent conductive layer thereon, a stack comprising an electrochromic layer, an ion conductor layer and a counter electrode layer; where the ion conductor layer is between the counter electrode layer and the electrochromic layer, and the first transparent conductive layer is between the transparent substrate and the stack;
   b. depositing a first sublayer of a second transparent conductive layer on either the electrochromic layer or the counter electrode layer, where the first sublayer is between about 10 nm and about 500 nm thick, and where the first sublayer is deposited on top of the stack;
   c. lithiating the electrochromic layer, the counter electrode layer, or the stack through the deposited first sublayer; and
   d. depositing a second sublayer of the second transparent conductive layer.

2. The method of claim 1, wherein the first sublayer is about 20 nm thick.

3. The method of claim 1, wherein c. is performed at a temperature of between about room temperature and about 500° C.

4. The method of claim 1, wherein the second sublayer is between about 10 nm and about 500 nm thick.

5. The method of claim 1, wherein c. is performed by at least one of sputtering, evaporation, laser ablation and exposure to a lithium salt.

6. The method of claim 1, wherein c. is performed by sputtering.

7. The method of claim 1, wherein the electrochromic layer comprises tungsten oxide, vanadium oxide, niobium oxide or iridium oxide.

8. The method of claim 1, wherein the electrochromic layer comprises tungsten oxide.

9. The method of claim 1, wherein the counter electrode layer comprises nickel oxide, tungsten-doped nickel oxide or iridium oxide.

10. The method of claim 1, wherein the counter electrode layer comprises tungsten-doped nickel oxide.

11. The method of claim 1, wherein the ion conductor layer comprises $SiO_2$, $TiO_2$, $Al_2O_3$ or $Ta_2O_5$.

12. The method of claim 1, wherein the second transparent conductive layer comprises indium tin oxide, fluorine-doped tin oxide, antimony-doped tin oxide or fluorine-doped aluminum oxide.

13. The method of claim 1, wherein the first and second transparent conductive layers have conductivities of less than 20 Ohms per square.

14. The method of claim 1, wherein depositing on a transparent substrate the stack comprises: depositing the electrochromic layer or the counter electrode layer on the first transparent conductive layer.

* * * * *